United States Patent [19]

Wong

[11] Patent Number: 4,645,953
[45] Date of Patent: Feb. 24, 1987

[54] CURRENT SOURCE WHICH SAVES POWER IN PROGRAMMABLE LOGIC ARRAY CIRCUITRY

[75] Inventor: Sing Y. Wong, Sunnyvale, Calif.

[73] Assignee: Monolithic Memories, Inc., Santa Clara, Calif.

[21] Appl. No.: 627,401

[22] Filed: Jul. 3, 1984

[51] Int. Cl.[4] .................. H03K 19/177; H03K 19/02
[52] U.S. Cl. .................. 307/466; 307/465; 307/454; 307/296 R; 364/716
[58] Field of Search .............. 307/441, 443, 454, 465, 307/466, 469, 452, 270, 296 R, 297, 200 A; 364/716

[56] References Cited

U.S. PATENT DOCUMENTS

| | | | |
|---|---|---|---|
| 4,183,093 | 1/1980 | Kawagoe | 307/469 X |
| 4,207,556 | 6/1980 | Sugiyama et al. | 364/716 X |
| 4,233,667 | 11/1980 | Devine et al. | 364/716 X |
| 4,501,977 | 2/1985 | Koike | 307/452 X |
| 4,506,173 | 3/1985 | Yum | 307/466 |

Primary Examiner—Stanley D. Miller
Assistant Examiner—D. R. Hudspeth
Attorney, Agent, or Firm—Steven F. Caserza; Alan H. MacPherson; Kenneth E. Leeds

[57] ABSTRACT

A current source for powering programmable arrays which provides means of eliminating the current supplied to portions of the array which are unimportant to the boolean arithmetic equation which the programmable array is programmed to model. The circuit includes fusible links (33-1 through 33-M) between the current source and portions of the circuit which may be unnecessary. Also included is means of opening (13-1 through 13-M) the fusible links (33-1 through 33-M) which connect the current source with the elements of the programmable array which may be unnecessary, thereby saving the power used to generate the current which would have been wasted in driving the unnecessary portions of the programmable array.

19 Claims, 4 Drawing Figures

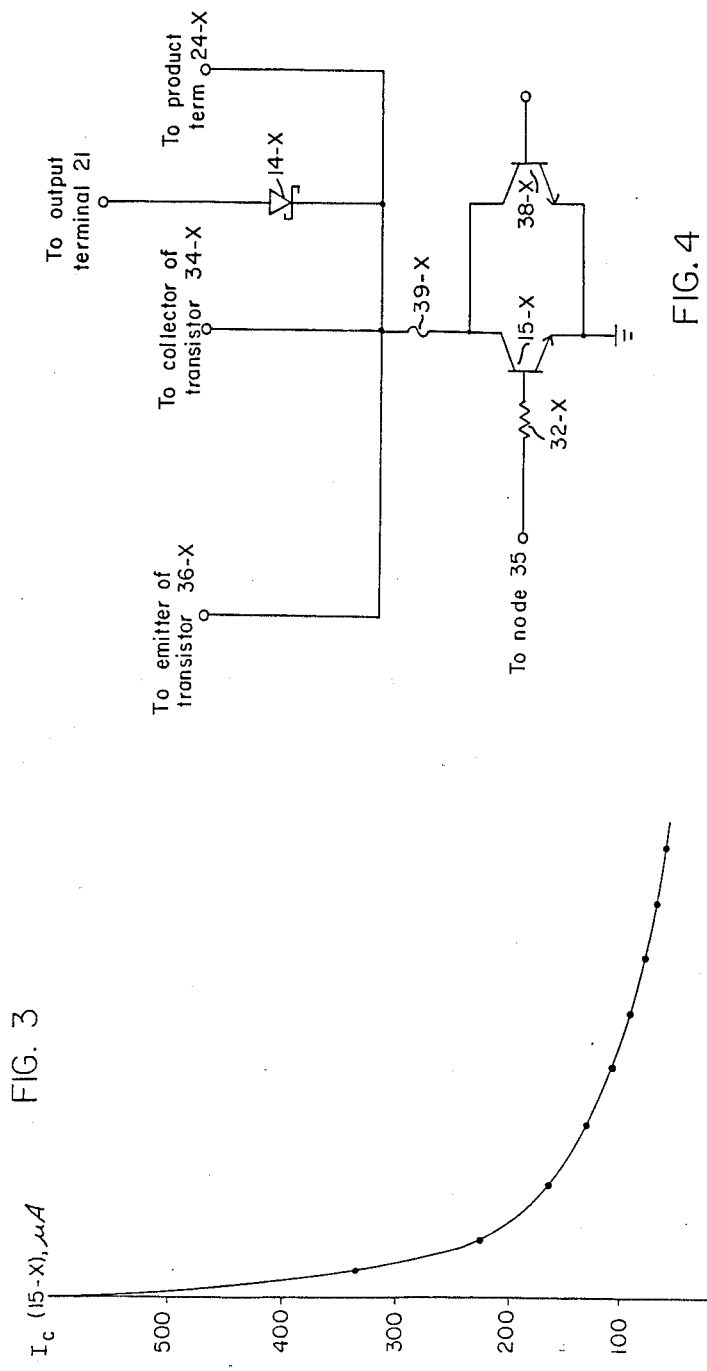

CURRENT SOURCE WHICH SAVES POWER IN PROGRAMMABLE LOGIC ARRAY CIRCUITRY

BACKGROUND OF THE INVENTION

A programmable logic array is a circuit which combines a large number of logical input signals according to the rules of boolean arithmetic to provide an output signal. Usually, a programmable logic array has several input leads and several output leads. Each output signal is the product of Boolean operations upon any of the input signals selected during programming. The input signals are selected by either disconnecting or connecting the input lead which receives the selected input signal to the circuitry which combines the selected input signals to form the output signal. A common method of combining input signals to form an output signal is to first combine one or more input signals in a logical OR function to form "product terms" and then to combine a selected number of the product terms in a logical AND function. In order to be as flexible as possible, the circuitry which combines the input signals must be capable of being connected to any combination of the input leads. In addition, it is desirable that as many of the product terms as possible may be connected to the AND gates which provide the output signals.

An array circuit which performs OR and AND functions as described is shown in FIG. 1. Input leads 10-1 through 10-N receive N input signals 9-1 through 9-N. Fuse array 23 is a means for selectively including or not including input signals 9-1 through 9-N in the M boolean equations which determine product terms 24-1 through 24-M. If the associated fuse 23-X-Y, where $1 \leq X \leq N$ and $1 \leq Y \leq M$, for input signal 9-X and product term 24-Y is intact, and the input signal 9-X is a logical 1 (typically 5 volts) then transistor 11-X-Y associated with input signal 9-X and product term 24-Y is on. Thus, the positive voltage source 12 pulls product term 24-Y to a logical 1. Any input signal which is a logical one and is connected to a particular product term pulls that product term to a logical 1; therefore, the transistors associated with that product term and those input signals function as a logical OR gate.

Product term 24-Y is connected to the cathode of associated Schottky diode 14-Y of diode bank 14. When product term 24-Y is a logical 0 (typically 0.5 volts) diode 14-Y is forward biased, and current flows from positive voltage source 12, through resistor 22 and through transistor 15-Y to ground. The current creates a voltage drop across resistor 22; therefore, output terminal 21 is a logical 0. Since any of product terms 24-1 through 24-M can pull the output signal on node 21 to a logical 0, diodes 14-1 through 14-M function as an AND gate which combines product terms 24-1 through 24-M.

Conversely, when product term 24-Y connected to the collector of transistor 15-Y is a logical 1, diode 14-Y is not forward biased and the collector current through transistor 15-Y is drawn from the positive voltage source 12 through one or more of the product term transistors 11-1-Y through 11-N-Y. If all of the product terms 24-1 through 24-M are a logical 1, none of diodes 14-1 through 14-M are forward biased and output terminal 21 is pulled to a logical 1 by positive voltage supply 12 through resistor 22.

Transistors 15-1 through 15-M serve as current sources. Bias circuit 25 provides bias to transistors 15-1 through 15-M. The collector current of NPN transistor 18 is fixed by resistor 20 and transistor 19. The current through resistor 20 is determined by summing voltages from positive voltage source 12 to ground. Thus, $$V(12) = I_{ref}R(20) + V_{BE}(19) + V_{BE}(18), \text{ where} \qquad (1)$$

V(12) is the voltage of positive voltage source 12, $I_{ref}$ is the current through resistor 20, R(20) is the resistance of resistor 20, $V_{BE}(19)$ is the base to emitter voltage drop of transistor (19), and $V_{BE}(18)$ is the base to emitter voltage drop of transistor 18.

The base to emitter voltage drops of transistors 18 and 19 are approximately 0.7 volts. Therefore, $$I_{ref} = V(12) - 1.4 \text{ volts}/R(20)$$

The base current of transistor 19 is negligible compared to $I_{ref}$; thus, the collector current in transistor 18 is approximately equal to $I_{ref}$. The base current in transistor 18 is determined by the equation $I_B(18) = I_C(18)/\beta(18)$, where $\beta(18)$ is the ratio between the collector current and base current in transistor 18, where $I_B(18)$ is the base current to transistor 18 and $I_C(18)$ is the collector current of transistor 18 (see Streetman, *Solid State Electronic Devices*, Equation 7-6 (1980), which is hereby incorporated by reference). For each base current value in a transistor there is a corresponding base to emitter voltage drop, as described in Streetman on page 152. Therefore, the base-emitter voltage drop of transistor 18 is that voltage which corresponds to $I_B(18) = I_C(18)/\beta(18)$. Because the base to emitter junctions of transistors 15-1 through 15-M are connected in parallel with the base to emitter junction of transistor 18, and because transistors 15-1 through 15-M are constructed in the same manner as transistor 18 (i.e., the same physical dimensions, same dopant levels, etc.), the base to emitter voltage of transistors 15-1 through 15-M are equal, and thus the collector currents in transistors 15-1 through 15-M are equal to the collector current in transistor 18. This configuration is called a "current mirror."

When fewer than the M product terms provided in a given programmable logic array are necessary to perform the boolean equation modeled by the array of FIG. 1, all of the fuses in the excess product terms, for example fuses 23-1-X through 23-N-X, must remain intact in order to properly model that boolean equation. For example, in an array where N is equal to 3, and M is equal to 3, and where the boolean equation to be modeled by the array is (AB)+(BC), the equation is modeled using the equivalent equation (ABC)+(AB)+(BC). If input signals, A, B and C are received on input leads 10-1, 10-2 and 10-3, respectively, then fuses 23-3-2 and fuse 23-1-3 are opened. If any of the fuses that are to remain intact are inadvertently opened, this boolean equation cannot be modeled by this circuit and the circuit is useless.

Of importance, transistor 15-1 associated with the product term 24-1 continues to draw current. This current serves no purpose because the equation modeled does not include the product term which uses this current. A product cannot be removed by opening the fuses associated with the product term because opening all the fuses associated with the product term causes a logical 0 output signal regardless of the state of the input signals. If fuses 23-1-1, 23-2-1 and 23-3-1 were opened, the output signal on output terminal 21 would always be logical 0. It is common in a fully programmed array for up to 70% of the product terms to remain unused. Therefore, up to 70% of the power provided to drive the array is wasted.

SUMMARY

In accordance with the teachings of this invention a novel programmable logic array circuit is provided which includes a current source for each product term. The current source is designed so that when a selected product term is unnecessary to the desired boolean equation to be executed by the programmable array, the current supplied to that product term is turned off, thereby providing a decrease in circuit power consumption.

BRIEF DESCRIPTION OF THE DRAWING

FIG. 3 is a graph depicting the collector current in a current source transistor versus the value of the base resistor in the circuit in FIG. 2; and FIG. 4 is a schematic diagram of an alternative embodiment of circuit 40 of FIG. 2.

DETAILED DESCRIPTION

Figure 2:
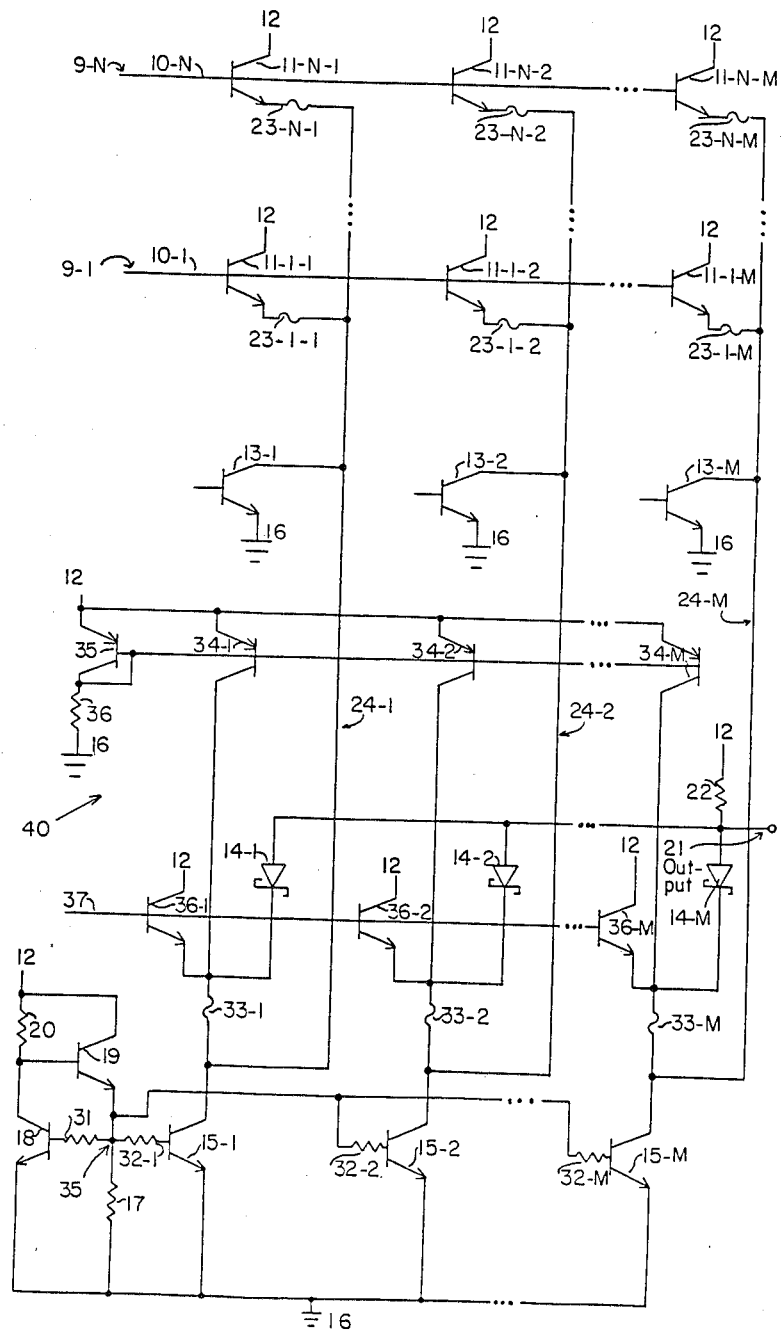
FIG. 2 is a schematic diagram of a programmable array constructed in accordance with the teachings of this invention.

FIG. 2 is a schematic diagram of one embodiment of a programmable logic array constructed in accordance with the teachings of this invention which includes a novel current source arrangement. Circuit 40 in FIG. 2 combines input signals 9-1 through 9-N in a logical OR function to form product terms 24-1 through 24-M. Diodes 14-1 through 14-M serve as an AND gate which combines product terms 24-1 through 24-M to provide an output signal on output terminal 21. Other embodiments of my invention (not shown) provide a programmable logic array in which the input signals are combined by logic gates other than OR gates to form the product terms, and the product terms are combined by logic gates other than AND gates to form the output signals.

Figure 1:
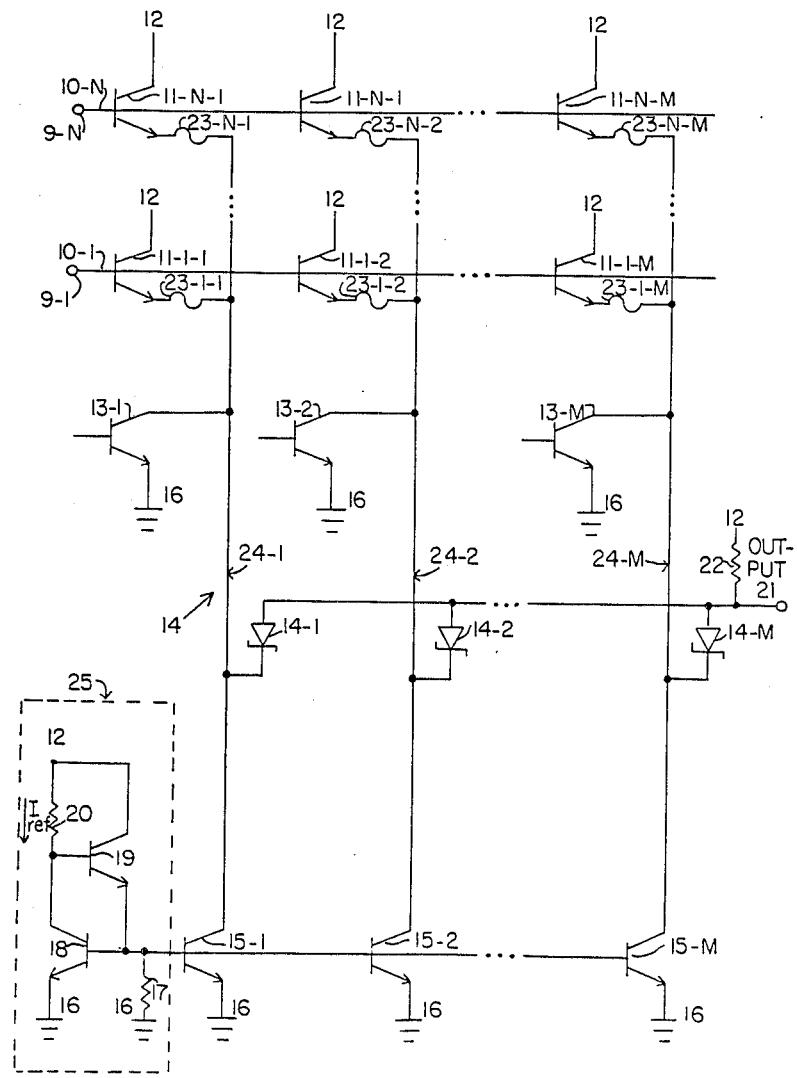
FIG. 1 is a schematic diagram of a prior art programmable array containing a standard current source.

Input signals 9-1 through 9-N are provided to circuit 40 via input leads 10-1 through 10-N, respectively, where N is the number of input signals. The input signals are combined as in the prior art circuit of FIG. 1 by transistor array 11 to form product terms 24-1 through 24-M, where M is the total number of product terms that may be combined to provide an output signal on output terminal 21. An input signal is selectively connected or disconnected from a particular product term by means of programming transistors 13-1 through 13-M and fusible links 23-1-1 through 23-N-M. When a selected input signal 9-X is to be disconnected from a particular product term 24-Y, the associated fusible link is opened in the following manner. First, the programming transistor 13-Y associated with that product term is turned on by bringing its base lead to a high voltage level. The selected input signal 9-X which is to be disconnected from product term 24-Y is made to be a logical 1. Therefore, both transistors 11-X-Y and programming transistor 13-Y are on, and the path from positive voltage source 12 to ground 16 through transistor 11-X-Y, fuse 23-X-Y, and programming transistor 13-X is nearly a short circuit. Thus, a large current flows through fusible link 23-X-Y causing it to open.

The transistors 11-1-Y through 11-N-Y associated with a particular product term 24-Y form an OR gate. If any of the input signals on input leads 10-1 through 10-N, which are not disconnected from product term 24-Y as stated above, is a logical 1, the associated transistors, 11-1-Y through 11-N-Y, respectively, are turned on, thereby connecting positive voltage source 12 to the product term, thereby making the product term a logical 1.

The current through transistor 15-X is determined by the current mirror formed by transistor 18 and transistors 15-1 through 15-M. The collector current of transistor 18 is fixed by resistor 20 and transistor 19. The base current of transistor 18 is very small relative to the collector current through transistor 18, thus the voltage drop across resistor 31 can be neglected. Therefore the collector current through transistor 18 is defined by the equation, $$V(12) = I_{ref}R(20) + V_{BE}(19) + V_{BE}(18) \qquad \text{where (2)}$$

V(12) is the voltage of positive voltage source 12,
$I_{ref}$ is the current through resistor 20,
R(20) is the resistance of resistor 20,
$V_{BE}(19)$ is the base to emitter voltage drop of transistor 19, which is approximately 0.7 volts,
$V_{BE}(18)$ is the base to emitter voltage drop of transistor 18, which is approximately 0.7 volts.

Solving for $I_{ref}$ the equation becomes, $$I_{ref} = V(12) - 1.4 \text{ volts}/R(20) \qquad (3)$$

The base current of transistor 19 is negligible compared to $I_{ref}$, therefore the collector current of transistor 18 $I_c(18)$ is approximately equal to $I_{ref}$. Thus, collector current $I_c(18)$ is determined by the value of resistor 20 (typically approximately 7kΩ). The voltage level at node 35 is determined by the base current of transistor 18. The base current of transistor 18 is that current which corresponds to the collector current $I_c(18)$, which is fixed by resistor 20. Resistors 31 and 32-1 through 32-M have the same resistance value (typically approximately 800Ω) Transistors 15-1 through 15-M are constructed so that they have the same characteristics as transistor 18 (i.e., the same physical dimensions, same doping levels, and thus the same electrical characteristics). Therefore, because voltage level of node 35 is determined by the base current through resistor 31 and through the baseemitter junction of transistor 18, the base current through each of transistors 15-1 through 15-M is the same as the base current through transistor 18. Therefore, the collector currents through transistors 15-1 through 15-M are the same as the collector current of transistor 18, and transistors 18 and 15-1 through 15-M form a current mirror.

When product term 24-Y is a logical 1 the current provided by transistor 15-Y flows from the product term 24-Y through transistor 15-Y to ground 16. If all of the product terms 24-1 through 24-M are a logical 1, then none of diodes 14-1 through 14-M are forward biased, and the output signal on output terminal 21 is a logical 1. Conversely, if any of product terms 24-1 through 24-M are a logical 0, then at least one of diodes 14-1 through 14-M is forward biased. Therefore, current flows from positive voltage source 12 through resistor 22, diode 14-Y, and through the collector of transistor 15-Y to ground. The current through resistor 22 creates a voltage drop and the output terminal 21 is forced to a logical 0. Therefore, diodes 14-1 through 14-M perform the function of an AND gate. Resistor 22 must be large enough (typically approximately 14kΩ) to provide a voltage drop sufficient to cause output terminal 21 to become a logical 0 when the current drawn by one of transistors 15-1 through 15-M is flowing through resistor 20.

Resistor 36, transistor 35 and transistors 34-1 through 34-N form a current mirror. The collector current of transistor 35 is fixed by resistor 36. Its value is determined by the equation, $$V(12) = V_{BE}(35) + I_C(35)R(36), \quad \text{where} \quad (4)$$

V(12) is the voltage level of positive voltage source 12, $V_{BE}(35)$ is the base to emitter voltage drop of transistor 35, $I_C(35)$ is the collector current through transistor 35, and R(36) is the resistance value of resistor 36.

Transistors 35 and 34-1 through 34-M are constructed to have the same physical dimensions and doping levels and thus they have the same electrical characteristics. The voltage drop from the base to emitter of transistor 35 is exactly the same as the voltage drop from the base to emitter of transistors 34-1 through 34-M because they are connected in parallel. The current mirror formed by transistor 35, resistor 36 and transistors 34-1 through 34-M provides means for pulling up the cathodes of diodes 14-1 through 14-M, respectively, to positive voltage source 12 when their associated product terms 24-1 through 24-M, respectively, are logical one, or when their associated fuses 33-1 through 33-M, respectively, are open.

In accordance with the teachings of this invention, when the boolean arithmetic equation which is to be performed by the programmable logic array does not require the total number of product terms available, a programming process that minimizes the current used to drive the unused product terms is utilized. For example, when product term 24-X is unused, its current source is removed by opening product term programming fuse 33-X. This is accomplished by first turning on programming transistor 13-X by bringing its base to a logical 1. All of input leads 10-1 through 10-N are then raised to a logical 1, thereby opening fuses 23-1-X through 23-N-X. To open fuse 33-X, the programming transistor 13-X associated with that product term 13-X is turned on by bringing its base to a high voltage level. The current through resistor 22 and diode 14-X is approximately 250 microamps and is not sufficient to open fuse 33-X. The additional current necessary to open 33-X is provided by transistor 36-X. The input signal on input terminal 37 is brought to a logical 1, which turns on transistors 36-1 through 36-M. The current flowing from positive voltage source 12 through transistor 36-X through fuse 33-X and through transistor 13-X to ground 16 is approximately 50 milliamps and is sufficient to open fuse 33-X.

When fuses 23-1-X through 23-N-X and fuse 33-X are open the collector of transistor 15-X is open and the collector current in transistor 15-X (this is called the collector current for reasons explained below) is approximately equal to the emitter current in transistor 15-X, as determined by the equation, $$V_{BE}(18) - I_C(15-X)R(32-X) - V_{BE}(15-X) = 0, \quad \text{where} \quad (5)$$

$V_{BE}(18)$ is the base to emitter voltage drop of transistor 18, $I_C(15-X)$ is the collector current in transistor 15-X, R(32-X) is the resistance value of resistor 32-X, and $V_{BE}(15-X)$ is the base to emitter voltage drop of transistor 15-X.

When the collector of transistor 15-X is open, current flows from the emitter of transistor 19, through resistor 32-X, and through the base-emitter junction of transistor 15-X to ground 16. With the collector of transistor 15-X open, the base current through resistor 32-X is significantly greater than the base current through resistor 32-X when the collector of transistor 15-X is not open because the emitter current which corresponds to the base-emitter voltage set by the current mirror arrangement must now be supplied totally by the base current, with no contribution by the collector. Therefore, the current through resistor 31 is much smaller than the current through resistor 32-X and the voltage drop across resistor 31 can be ignored in equation 5. For purposes of this specification, the current in transistor 15-X is called the collector current even though the collector is open.

As explained in Streetman *Solid State Electronics Devices* equation 5-25 (1980), the current through a pn junction expressed as function of the voltage across the junction is $$I = I_s(e^{V/V_T} - 1), \quad \text{where} \quad (6)$$

I is the current through the pn junction;

$I_s$ is the reverse saturation current for the pn junction;

$V_T$ is equal to kT/q where k is Boltzman's constant, which is equal to 0.0259 at room temperature;

T is the temperature of the pn junction;

q is the charge of an electron; and

V is the voltage across the pn junction.

Solving equation (6) for V gives $$V = V_T Ln(I/I_s + 1), \quad \text{where} \quad (7)$$

Ln is the natural logarithm function.

In a forward biased pn junction I is much greater than $I_s$ so $$V \approx V_T Ln(I/I_s) \quad (8)$$

In a forward biased transistor most of the current through the base emitter junction is the collector current, thus, $$V_{BE} \approx V_T Ln(I_c/I_s) \quad (9)$$

Combining equations 5 and 9 yields, $$V_T Ln(I_C(18)/I_S(18)) - I_C(15 - X)R(32 - X) - V_T Ln(I_C(15 - X)/I_S(15 - X)) = 0 \quad (10)$$

where, $I_C(18)$ is the collector current in transistor 18;

$I_S(18)$ is the reverse saturation current of transistor 18;

$I_C(15-X)$ is the collector current of transistor 15-X; and $I_S(15-X)$ is the reverse saturation current of transistor 15-X.

$I_C(18)$ is approximately 580 microamps, $V_T$ is approximately 26 millivolts, and $I_S(18)$ is approximately $9 \times 10^{-18}$ amperes. $I_S(15-X)$ is approximately $9 \times 10^{-18}$ amperes. Substituting these values in equation 10 and plotting the results of the equation on a graph of $I_C(15-X)$ versus $R(32-X)$, the graph of FIG. 3 is derived. Therefore by increasing the value of resistors 31 and 32-1 through 32-M (which must be equal as previously explained) the current drawn when the fuses connected to the collector of transistor 15-X are open is minimized.

The product terms that are not removed from operation of the array are combined in a logical AND manner by diodes 14-1 through 14-M and resistor 22. When product term 24-Z, where $1 \leq Z \leq M$, is a logical 0, diode 14-Z is forward biased and a voltage drop across resistor 22 develops creating a logical 0 on output terminal 21. When none of product terms 24-1 through 24-M is a logical 0, then none of diodes 14-1 through 14-M is forward biased, no current flows through resistor 22, and a logical 1 is provided on output terminal 21. Therefore, diode bank 14 and resistor 22 function as an AND gate receiving the remaining product terms as input signals and providing an output signal on output terminal 21.

An additional feature of this invention is that errors in programming a programmable logic array may be repaired if unused product terms remain unprogrammed. This is useful, for example, during developmental work where power consumption is not a major problem, but it is useful to have the ability to alter boolean expressions without the need to purchase new logic array devices. If a fuse is inadvertently opened, the programmer can open the remaining product term fuses of that product term. The product term of the boolean equation that would have been modeled by removed product term is then modeled with a previously unused product term. After the programmable logic array has been fully programmed and tested, the remaining unused product terms can, if desired, be removed from the circuit by opening their associated product term current source fuses. In prior art circuits such error correction is not possible.

In an alternative embodiment of this invention, fuses 33-1 through 33-M of FIG. 2 are omitted and fuses 39-1 through 39-M are included as exemplified in FIG. 4. To disable a current source, a logical 1 is applied to input lead 37 (FIG. 2) and to the base of transistor 38-X (FIG. 4). The current flowing through transistor 36-X, fuse 39-X and transistor 38-X is sufficient to open fuse 39-X. The logical 1 signal is then removed from input lead 37 (FIG. 2) and the base of transistor 38-X (FIG. 4). With fuse 39-X open, forward current through diode 14-X has no path to ground, therefore, diode 14-X can not be forward biased. Thus product term 24-X has no effect on the output signal on output terminal 21 (FIG. 2) and is effectively removed from the array. In this embodiment it is not necessary to open all fuses 23-1-X through 23-N-X in order to remove product term 24-X; all that is required is to open fuse 39-X.

While this specification illustrates specific embodiments of this invention, it is not to be interpreted as limiting the scope of the invention. Many embodiments of this invention will become evident to those of ordinary skill in the art in light of the teachings of this specification.

I claim:

1. A programmable logic array circuit comprising:
   a plurality of input terminals for receiving a plurality of input signals;
   product term means having a product output lead for providing an output signal in response to said plurality of input signals;
   a current source for providing current to said product term means; and
   disable means for selectively and permanently disabling said current source.

2. A programmable logic array circuit as in claim 1 wherein said disable means comprises a programmable element which specifies when said current source is to be permanently disabled.

3. A programmable logic array circuit as in claim 2 wherein said programmable element is a fuse.

4. A programmable logic array circuit as in claim 1 wherein said product term means comprises:
   a product logic gate having a plurality of input leads for receiving said plurality of input signals, and an output lead serving as said product output lead, wherein said logic gate comprises one or more gates selected from the group of gates consisting of inverters, AND, NAND, OR, NOR, Exclusive-OR, and Exclusive-NOR gates.

5. A programmable logic array circuit as in claim 4 wherein said product logic gate comprises:
   a plurality of product input programming means, each uniquely associated with an input lead of said product logic gate, wherein, when a product input programming means is in a first state, said associated input lead of said product logic gate is disconnected from said product logic gate, and wherein, when said product input programming means is in a second state, said associated input lead of said product logic gate is connected to said logic gate.

6. A programmable logic array circuit as in claim 1 wherein said current source comprises:
   a transistor having a control input lead, a first current handling lead for providing current, and a second current handling terminal connected to a reference potential; and
   a bias voltage source connected to said control input lead.

7. A programmable logic array circuit as in claim 1 wherein said current source comprises:
   a transistor having a control input lead, a first current handling lead for providing current, and a second current handling terminal connected to a reference potential;
   a bias voltage source having an output lead; and
   current limiting means having a first lead connected to said control input lead and a second lead connected to said output lead of said bias voltage source, wherein said current limiting means limits the current supplied to said control input lead of said transistor when said current source is disabled.

8. A programmable logic array circuit as in claim 1 wherein said disable means comprises a programmable element connected between said current source and said product term means.

9. A programmable logic array circuit as in claim 8 wherein said programmable element comprises a fuse.

10. A programmable logic array circuit comprising:
    a plurality of input terminals for receiving a plurality of input signals;
    a plurality of M product term means, where M is a positive integer, each having a product output lead for providing an output signal in response to said plurality of input signals;

a logic gate having a plurality of M input leads each uniquely connected to one of said product output leads, and having an output lead serving as an output terminal;

a plurality of M current source means, each for providing current to an associated one of said product term means; and a plurality of M disable means, each uniquely associated with one of said M current source means, each of said disable means capable of selectively disabling its associated current source and thereby effectively disconnecting said product output lead from said logic gate.

11. A programmable logic array circuit as in claim 10 wherein each said disable means comprises a programmable element which specifies when its associated current source is to be disabled.

12. A programmable logic array circuit as in claim 11 wherein said programmable element is a fuse.

13. A programmable logic array circuit as in claim 10 wherein said logic gate comprises one or more gates selected from the group of gates consisting of inverters, AND, NAND, OR, NOR, Exclusive-OR, and Exclusive-NOR gates.

14. A programmable logic array circuit as in claim 10 wherein said product term means comprises:

a product logic gate having a plurality of input leads for receiving said plurality of input signals, and an output lead serving as said product output lead, wherein said logic gate comprising one or more gates selected from the group of gates consisting of inverters, AND, NAND, OR, NOR, Exclusive-OR, and Exclusive-NOR gates.

15. A programmable logic array circuit as in claim 14 wherein each said product logic gate comprises:

a plurality of product input programming means, each uniquely associated with an input lead of said product logic gate, wherein when said product input programming means is in a first state, said associated input lead of said product logic gate is disconnected from said product logic gate, and where, when said product input programming means is in a second state, said associated input lead of said product logic gate is connected to said logic gate.

16. A programmable logic array circuit as in claim 10 wherein said current source comprises:

a transistor having a control input lead, a first current handling lead for providing current, and a second current handling terminal connected to a reference potential; and a bias voltage source connected to said control input lead.

17. A programmable logic array circuit as in claim 10 wherein each said current source comprises:

a transistor having a control input lead, a first current handling lead for providing current, and a second current handling terminal connected to a reference potential;

a bias voltage source having an output lead; and current limiting means having a first lead connected to said control input lead and a second lead connected to said output lead of said bias voltage source, wherein said current limiting means limits the current supplied to said control input lead of said transistor when said current source is disabled.

18. A programmable logic array circuit as in claim 10 wherein said disable means comprises a programmable element connected between said current source and said product output lead.

19. A programmable logic array circuit as in claim 18 wherein said disable means comprises a programmable element connected between said current source and said product output lead.

* * * * *